United States Patent
Koo

(10) Patent No.: US 10,643,966 B2
(45) Date of Patent: May 5, 2020

(54) ELECTRICAL INTERCONNECTIONS FOR SEMICONDUCTOR DEVICES AND METHODS FOR FORMING THE SAME

(71) Applicant: Samsung Electronics Co., Ltd., Suwon-si, Gyeonggi-do (KR)

(72) Inventor: Hyosung Koo, Asan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/040,507

(22) Filed: Jul. 19, 2018

(65) Prior Publication Data

US 2018/0331064 A1 Nov. 15, 2018

Related U.S. Application Data

(62) Division of application No. 15/378,029, filed on Dec. 13, 2016, now abandoned.

(30) Foreign Application Priority Data

Dec. 17, 2015 (KR) .......................... 10-2015-0181143

(51) Int. Cl.
*H01L 23/00* (2006.01)

(52) U.S. Cl.
CPC .............. *H01L 24/48* (2013.01); *H01L 24/85* (2013.01); *H01L 24/45* (2013.01); *H01L 24/78* (2013.01); *H01L 2224/05599* (2013.01); *H01L 2224/45144* (2013.01); *H01L 2224/45147* (2013.01); *H01L 2224/48091* (2013.01); *H01L 2224/48458* (2013.01); *H01L 2224/48465* (2013.01); *H01L 2224/78301* (2013.01); *H01L 2224/85045* (2013.01); *H01L 2224/85181* (2013.01);

(Continued)

(58) Field of Classification Search
CPC ......... H01L 24/45; H01L 24/48; H01L 24/85; H01L 2224/48227; H01L 2224/48247; H01L 2224/48257; H01L 2224/4845; H01L 2224/48451; H01L 2224/47; H01L 2224/48; H01L 2224/484; H01L 2224/48476; H01L 2224/84365; H01L 2224/8534; H01L 2224/85345

See application file for complete search history.

(56) References Cited

U.S. PATENT DOCUMENTS 4,821,945 A 4/1989 Chase et al.
6,079,610 A 6/2000 Maeda et al.

(Continued)

*Primary Examiner* — Hsien Ming Lee
(74) *Attorney, Agent, or Firm* — Renaissance IP Law Group LLP

(57) ABSTRACT

An electrical interconnection includes a wire loop having a first end bonded to a first bonding site using a first bonding portion, and a second end bonded to a second bonding site using a second bonding portion. The second bonding portion includes a folded portion having a wire that extends from the second end of the wire loop and is folded on the second bonding site. The folded portion includes a first folded portion connected to the second end of the wire loop and extending toward the first bonding site, a second folded portion provided on the first folded portion, and a tail protruding from a portion of the second folded portion. An interface is formed between the first and second folded portions. A top surface of the second folded portion includes an inclined surface recessed toward the first folded portion.

5 Claims, 9 Drawing Sheets

(52) U.S. Cl.
CPC ............ *H01L 2224/85186* (2013.01); *H01L 2224/85196* (2013.01); *H01L 2224/85345* (2013.01); *H01L 2924/00014* (2013.01)

(56) References Cited

U.S. PATENT DOCUMENTS

| | | |
|---|---|---|
| 7,192,861 B2 | 3/2007 | Ano |
| 7,314,157 B2 | 1/2008 | Wong |
| 7,371,676 B2 | 5/2008 | Hembree |
| 7,651,022 B2 | 1/2010 | Babinetz et al. |
| 8,123,108 B2 * | 2/2012 | Akiyama ............ B23K 20/007 228/180.5 |
| 2002/0014515 A1 | 2/2002 | Koduri |
| 2005/0042855 A1 | 2/2005 | Ano |
| 2006/0032894 A1 | 2/2006 | Wong |
| 2006/0228825 A1 | 10/2006 | Hembree |
| 2006/0290744 A1 | 12/2006 | Lee et al. |
| 2007/0199974 A1 | 8/2007 | Babinetz et al. |
| 2008/0116548 A1 | 5/2008 | Li et al. |
| 2010/0186991 A1 * | 7/2010 | Tajima ................ B23K 3/0623 174/126.1 |
| 2012/0286427 A1 | 11/2012 | Sumitomo et al. |
| 2015/0187729 A1 | 7/2015 | Chew |

\* cited by examiner

ELECTRICAL INTERCONNECTIONS FOR SEMICONDUCTOR DEVICES AND METHODS FOR FORMING THE SAME

CROSS-REFERENCE TO RELATED APPLICATION

This U.S. non-provisional patent application is a divisional of U.S. patent application Ser. No. 15/378,029, filed on Dec. 13, 2016, which claims priority under 35 U.S.C. § 119 to Korean Patent Application No. 10-2015-0181143, filed on Dec. 17, 2015, in the Korean Intellectual Property Office, the disclosure of which is hereby incorporated by reference in its entirety.

BACKGROUND

Embodiments of the inventive concepts relate to a semiconductor and, more particularly, to improved electrical interconnections for semiconductor devices and methods for forming the same.

There are various techniques for electrically connecting a bonding pad or lead of a semiconductor device to a bonding pad or lead of an electronic device (e.g., a semiconductor device, a printed circuit board, or an interposer). A wire bonding technique is widely used as one of these techniques. The strength of the connection or the adhesive force of the bonding wire to the bonding pad may greatly affect electrical and mechanical durability of semiconductor products.

SUMMARY

Embodiments of the inventive concepts may provide improved electrical interconnections for semiconductor devices and methods for forming the same.

Embodiments of the inventive concepts may also provide electrical interconnections for semiconductor devices, of which an adhesive force is improved or strengthened, along with methods of forming the same.

In an aspect, an electrical interconnection for a semiconductor device may include a wire loop having a first end bonded to a first bonding site using a first bonding portion and a second end bonded to a second bonding site using a second bonding portion. The second bonding portion may include a folded portion having a wire that extends from the second end of the wire loop and is folded onto the second bonding site. The folded portion may include a first folded portion connected to the second end of the wire loop which extends toward the first bonding site, a second folded portion extending from the first folded portion and provided on the first folded portion, and a tail end protruding from an end portion of the second folded portion. A bottom surface of the second folded portion may be in contact with the first folded portion to form an interface between the first and second folded portions. A top surface of the second folded portion may be recessed toward the first folded portion.

In an aspect, a method of forming an electrical interconnection for a semiconductor device may include performing a first bonding process by using a bonding apparatus in which a wire is provided to connect the wire to a first bonding site, providing the wire from the bonding apparatus to a second bonding site to form a wire loop between the first bonding site and the second bonding site, and using the bonding apparatus to perform a second bonding process on the second bonding site to bond the wire loop to the second bonding site. Performing the second bonding process may include moving the bonding apparatus along an overlapping trajectory on the second bonding site to form a folded portion on one end of the wire loop bonded to the second bonding site. The overlapping trajectory may include a first trajectory along a first upward direction moving vertically away from the one end of the wire loop, a second trajectory moving along a first downward diagonal direction beginning over the one end of the wire loop, moving horizontally toward the first bonding site, and becoming vertically closer to the second bonding site, a third trajectory moving along a second upward direction vertically away from the one end of the wire loop, and a fourth trajectory moving along a second downward diagonal direction beginning from nearer the first bonding site and moving horizontally toward and vertically closer to the second bonding site over the one end of the wire loop. In some embodiments, an overlapping stitch bond for a semiconductor device having a wire loop comprising an end bonded to a bonding site using the overlapping stitch bond, the overlapping stitch bond comprising: a folded portion having a segment that extends from the end of the wire loop and is folded over the end of the wire loop on the bonding site.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
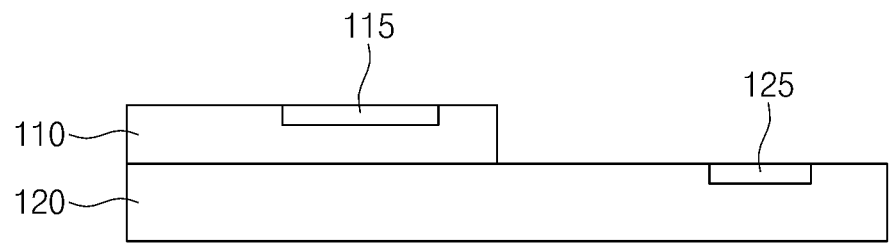
FIGS. 1A to 1E are cross-sectional views of a semiconductor device and bonding apparatus illustrating a method of forming an electrical interconnection for a semiconductor device, according to some embodiments of the inventive concepts.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concept to those skilled in the art.

Exemplary embodiments of aspects of the present inventive concepts explained and illustrated herein include their complementary counterparts. The same reference numerals or the same reference designators denote the same elements throughout the specification.

FIGS. 1A to 1E are cross-sectional views illustrating a method of forming an electrical interconnection for a semiconductor device, according to some embodiments of the inventive concepts.

Referring to FIG. 1A, a first device 110 and a second device 120 may be provided. The first device 110 may have a first bonding pad 115, and the second device 120 may have a second bonding pad 125. In some embodiments, the first device 110 may be provided on the second device 120 in such a way that the second bonding pad 125 is exposed. In some embodiments, the first device 110 and the second device 120 may be vertically spaced apart from each other. In some embodiments, the first device 110 and the second device 120 may be laterally spaced apart from each other and arranged at substantially the same level or different levels. In some embodiments, at least one of the first device 110 and the second device 120 may have a lead or a lead frame instead of the bonding pad.

One of the first and second devices 110 and 120 may be a semiconductor chip, and the other of the first and second devices 110 and 120 may be a printed circuit board or an interposer. For example, the second device 120 may be the printed circuit board or the interposer, and the first device 110 may be the semiconductor chip. In some embodiments, the first device 110 and the second device 120 may be semiconductor chips that may be the same as or different from each other. For example, the first device 110 may be a memory chip, and the second device 120 may be a logic chip.

A bonding apparatus having a capillary 90 may be provided over a first bonding site, e.g., the first bonding pad 115. In some embodiments, the capillary 90 may be disposed at a level corresponding to a predetermined height (e.g., an electric frame-off (EFO) height) from the first bonding pad 115. A wire 95 may protrude from a central hole of the capillary 90. The wire 95 may be formed of a conductive material such as gold or copper. An electric spark 80 may be provided to the wire 95 protruding from a bottom end of the capillary 90 to melt the protruding portion (i.e., a bottom end portion) of the wire 95. Thus, a free air ball 97 may be formed at the bottom end of the capillary 90. In some embodiments, ultrasonic energy or heat instead of the electric spark 80 may be provided to the bottom end portion of the wire 95. Movement of the wire 95 within the capillary 90 may be restricted by a closing operation of a clamp 92. As described above, the free air ball 97 may be formed at the EFO height by applying the electric spark 80.

Figure 1B:
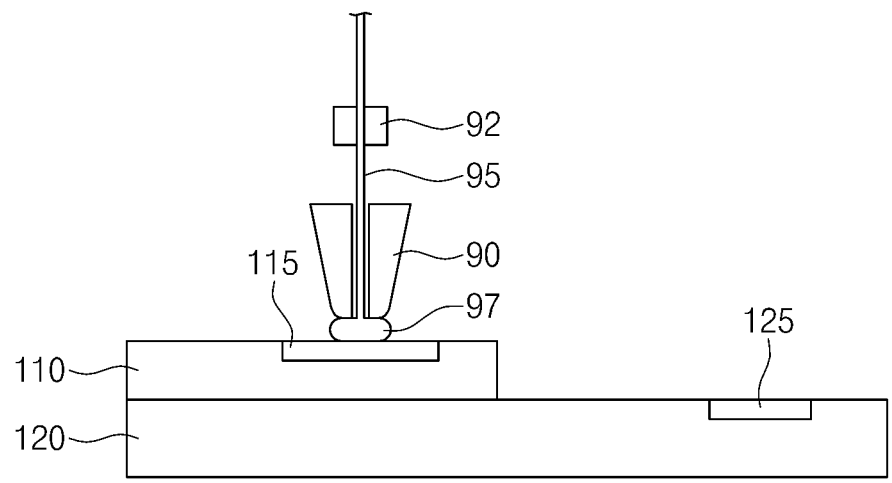

Referring to FIG. 1B, the capillary 90 may be moved toward the first bonding pad 115 in a state in which the clamp 92 is closed, and thus the free air ball 97 may come in contact with the first bonding pad 115. The free air ball 97 may be pressed between the capillary 90 and the first bonding pad 115. Heat and/or ultrasonic energy may be provided to the first device 110 to bond the free air ball 97 to the first bonding pad 115. Thus, a ball bonding portion (or a first bonding portion) including the free air ball 97 bonded to the first bonding pad 115 may be formed.

Figure 1C:
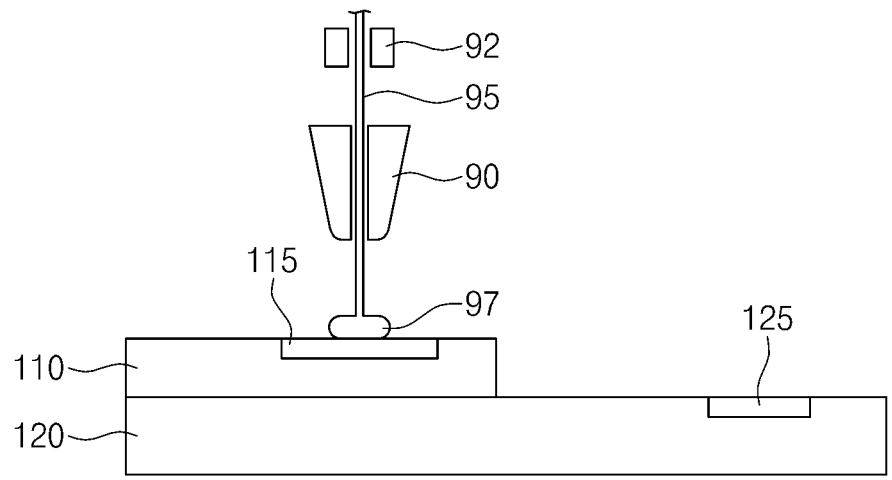

Referring to FIG. 1C, the capillary 90 may be moved in a direction away from the first bonding pad 115. At this time, the clamp 92 may be in an opened state. As the capillary 90 moves upwardly, the wire 95 may have a shape which extends from the free air ball 97 bonded to the first bonding pad 115 in, for example, a vertical direction.

Figure 1D:
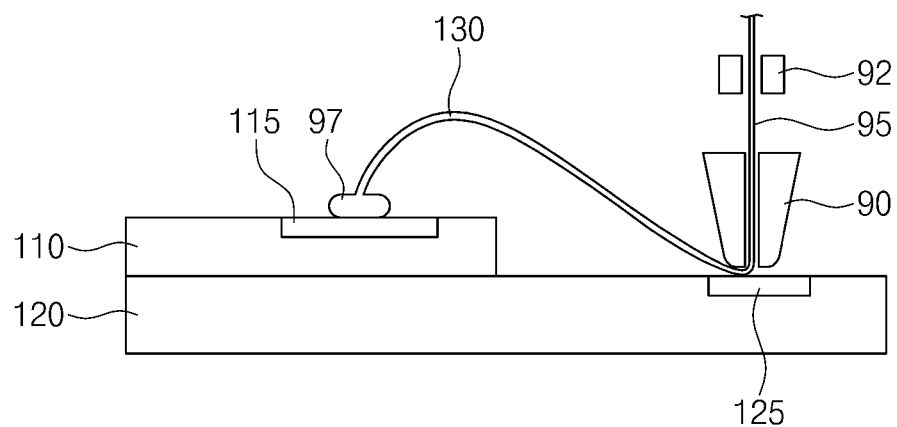

Referring to FIG. 1D, the capillary 90 raised from the first bonding pad 115 may move toward a second bonding site, for example, the second bonding pad 125. At this time, the clamp 92 may be in an opened state. Since the capillary 90 moves with the clamp 92 open, the wire 95 provided from the bottom end of the capillary 90 may extend along the direction of movement of the capillary 90. Thus, a wire loop 130 may be formed between the first bonding pad 115 and the second bonding pad 125.

Figure 1E:
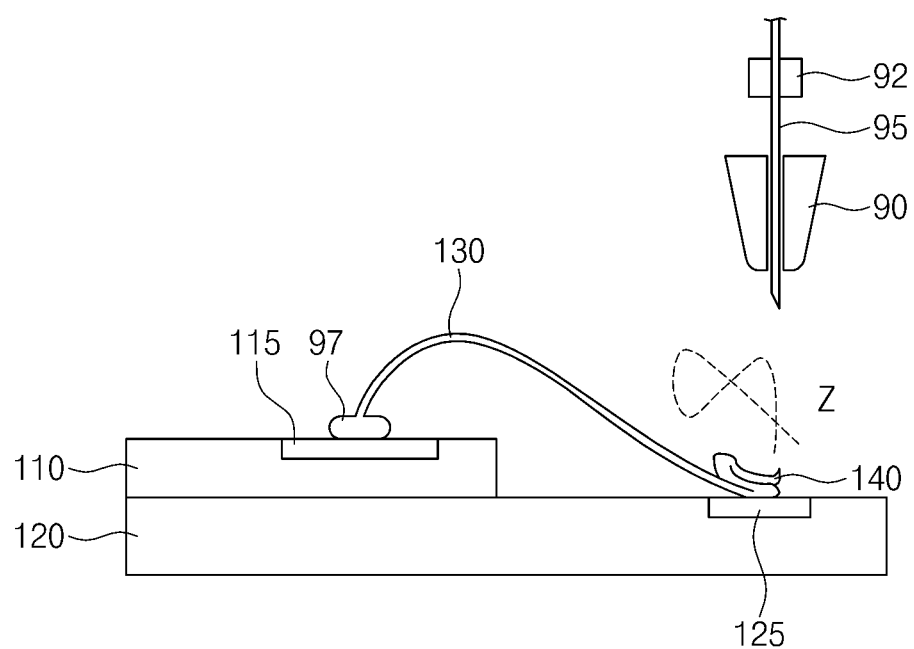

Referring to FIG. 1E, the capillary 90 may be moved along an overlapping (or ribbon-shaped) trajectory Z at an end of the wire loop 130 without cutting the wire 95. At this time, the clamp 92 may be in an opened state. Since the capillary 90 is moved along the overlapping trajectory Z with the clamp 92 open, a folded portion 140 of the wire 95 may be formed at an end portion of the wire loop 130. The folded portion 140 may be bonded to the second bonding pad 125. The capillary 90 may then be moved in a vertical direction away from the second bonding pad 125 with the clamp 92 closed, and thus the wire 95 may be cut from the folded portion 140. In some embodiments, heat and/or ultrasonic energy may be applied to the wire 95 when the wire 95 is cut from the folded portion 140.

Thus, a stitch bonding portion (or a second bonding portion) of the wire loop 130, which is bonded to the second bonding pad 125, may be formed. The stitch bonding portion may include the folded portion 140. The capillary 90 may be raised to a level corresponding to an EFO height. Thereafter, a new wire bonding process may be performed using the capillary 90, or the capillary 90 may be in a standby state. For example, the processes of FIGS. 1A to 1E may be repeated using the capillary 90.

According to the present embodiment, a first end of the wire loop 130 may be bonded to the first bonding pad 115 by means of the ball bonding portion (or the first bonding portion) including the free air ball 97, and a second end of the wire loop 130 may be bonded to the second bonding pad 125 by means of the stitch bonding portion (or the second bonding portion) including the folded portion 140. The second end of the wire loop 130 may be in contact with the second bonding pad 125.

FIGS. 2A to 2F are cross-sectional views illustrating a method of forming a stitch bonding portion of a bonding wire in an electrical interconnection according to some embodiments of the inventive concepts.

Figure 2A:
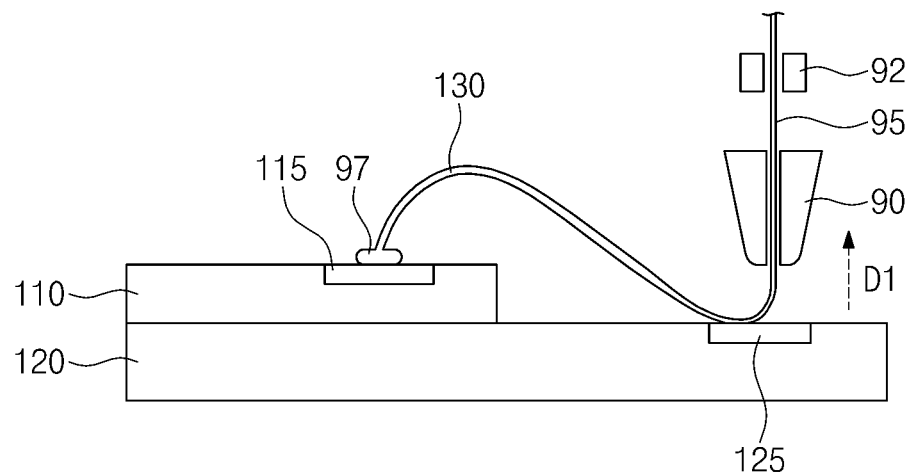
FIGS. 2A to 2F are cross-sectional views of a semiconductor device and bonding apparatus illustrating a method of forming a stitch bonding portion of a bonding wire in an electrical interconnection according to some embodiments of the inventive concepts.

Referring to FIG. 2A, the capillary 90 may move vertically in a first direction D1 away from the second bonding pad 125 with the clamp 92 open (e.g., a first rising operation). The wire 95 may extend from the wire loop 130. At this stage, the wire 95 from the capillary 90 may substantially vertically extend from the second bonding pad 125, and at least a portion of wire 95 may be curved between the second bonding pad 125 and the capillary 90. A process of forming a free air ball may be omitted during or before the first rising operation of the capillary 90.

Figure 2B:
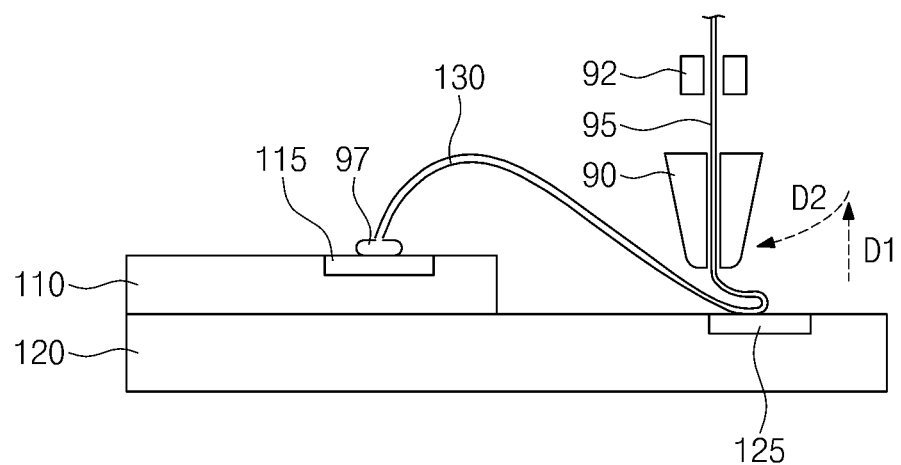

Referring to FIG. 2B, the capillary 90 that has been moved along the first direction D1 may then be moved along a second direction D2 (e.g., a first diagonal direction) downwardly toward the second bonding pad 125 and horizontally toward first bonding pad 115 with the clamp 92 open (e.g., a first downward diagonal operation or a left downward diagonal operation). The wire 95 may be folded at an end portion of the wire loop 130, which is bonded to the second bonding pad 125.

Figure 2C:
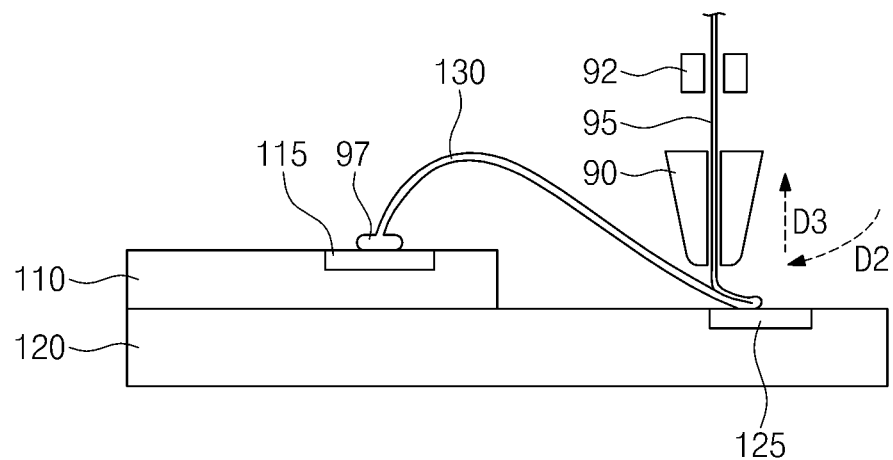

Referring to FIG. 2C, the capillary 90 that has been moved along the second direction D2 may then be moved along a third direction D3 vertically away from the second bonding pad 125 with the clamp 92 still open (e.g., a second rising operation). The wire 95 may vertically extend from the second bonding pad 125 on the end portion of the wire loop 130.

Figure 2D:
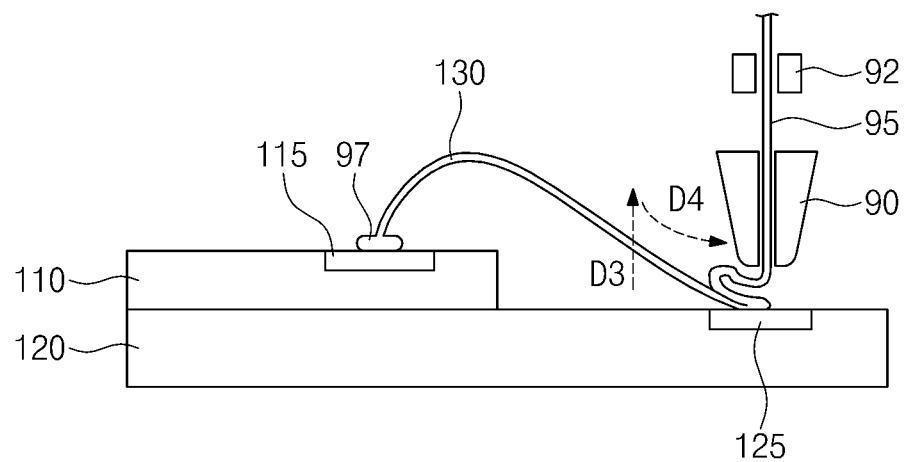

Referring to FIG. 2D, the capillary 90 that has been moved along the third direction D3 may then move along a fourth direction D4 (e.g., a second diagonal direction) vertically toward the second bonding pad 125 and horizontally away from first bonding pad 115 with the clamp 92 open (e.g., a second downward diagonal operation or a right downward diagonal operation). The wire 95 may be refolded on the end portion of the wire loop 130.

Figure 2E:
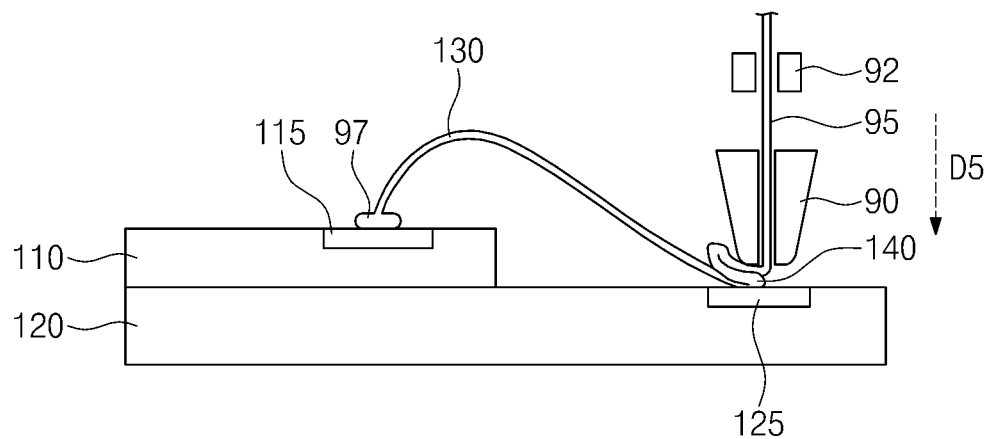

Referring to FIG. 2E, the capillary 90 that has been moved along the fourth direction D4 may descend vertically toward the second bonding pad 125 in a fifth direction D5. At this time, the clamp 92 may remain in an opened state. The folded portion 140 may be formed on the second bonding pad 125 by the descending capillary 90.

Figure 2F:
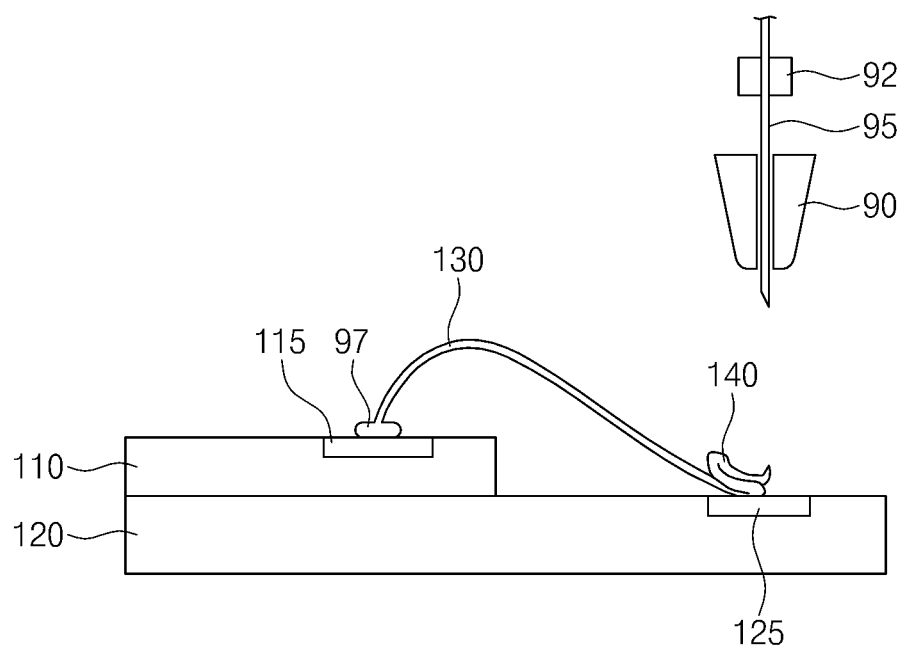

Referring to FIG. 2F, the capillary 90 may then be raised in a direction vertically away from the folded portion 140 with the clamp 92 open. Subsequently, the clamp 92 may be closed and the capillary 90 may be raised further such that the wire 92 is cut from the folded portion 140. Thus, the stitch bonding portion (or the second bonding portion) may be formed on the second bonding pad 125.

In the operations of the capillary 90 described above with reference to FIGS. 2A to 2D, a vertical movement distance of the capillary 90 along the first direction D1, the third direction D3, or each of the first and third directions D1 and D3, may be smaller than the EFO height. In some embodiments, if the EFO height from the second or first bonding pad 125 or 115 ranges from about 6,000 μm to about 7,000 μm (e.g., 6,500 μm), the vertical movement distance of the capillary 90 may range from about 50 μm to about 200 μm.

A horizontal-movement distance of the capillary 90 along the second direction D2, the fourth direction D4, or each of the second and fourth directions D2 and D4, may be equal to or different from the vertical movement distance. In some embodiments, the horizontal movement distance of the capillary 90 may range from about 30 μm to about 80 μm. At least one of an angle between the first and second directions D1 and D2 and an angle between the third and fourth directions D3 and D4 may range from about 60 degrees to about 80 degrees.

Figure 3A:
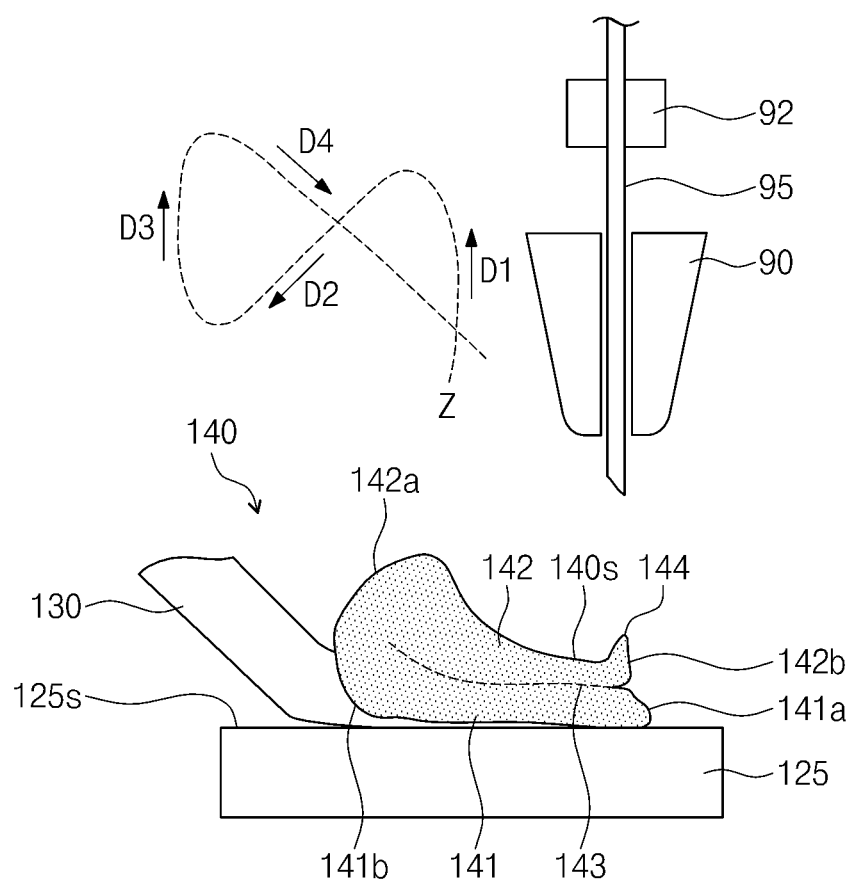
FIG. 3A is an enlarged cross-sectional view of a portion of the semiconductor device and bonding apparatus of FIG. 2F further illustrating a movement pattern of the bonding apparatus according to some embodiments of the inventive concepts.
Figure 3B:
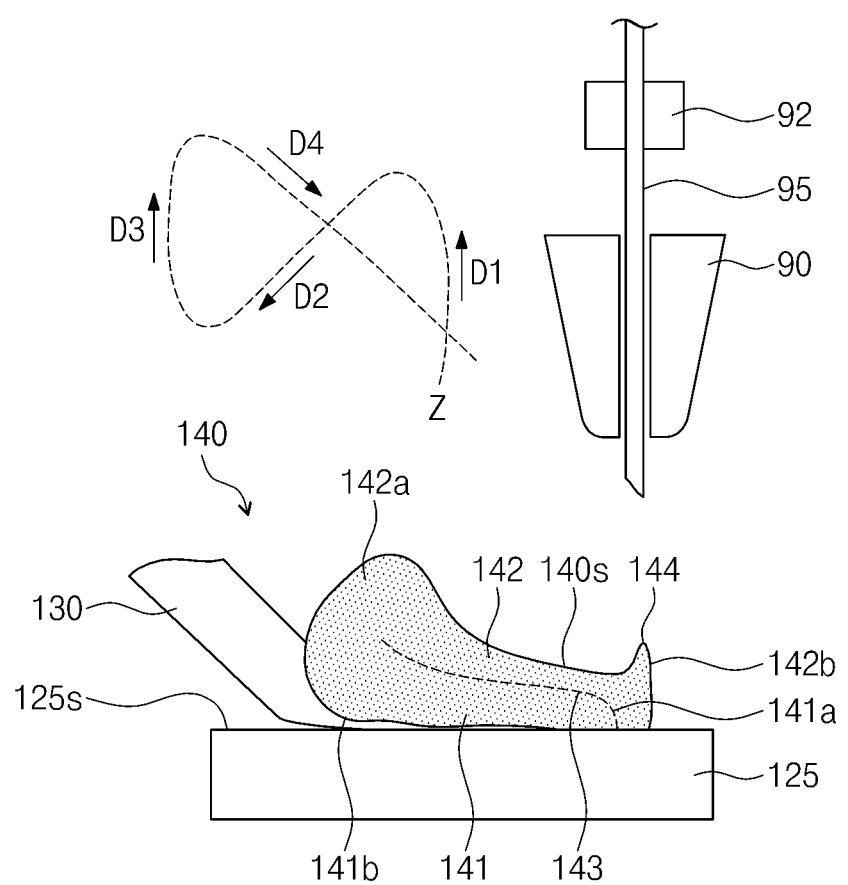
FIG. 3B is an enlarged cross-sectional view of a portion of the semiconductor device and bonding apparatus of FIG. 2F further illustrating a movement pattern of the bonding apparatus according to some alternative embodiments of the inventive concepts.

FIG. 3A is an enlarged cross-sectional view of a portion of the semiconductor device and bonding apparatus of FIG. 2F, illustrating a movement pattern of the bonding apparatus according to some embodiments of the inventive concepts. FIG. 3B is another enlarged cross-sectional view of a portion of the semiconductor device and bonding apparatus of FIG. 2F illustrating a movement pattern of the bonding apparatus according to an alternative embodiment of the inventive concepts.

Referring to FIG. 3A, the folded portion 140 may be formed by movement of the capillary 90 along the first to fourth directions D1 to D4, i.e., an overlapping trajectory (i.e., ribbon motion) Z of the capillary 90. Since the wire 95 is provided from the capillary 90 moving along the overlapping (i.e., ribbon-shaped) trajectory Z, the stitch bonding portion including the folded portion 140 may be formed at one end portion of the wire loop 130. The folded portion 140 may include a first folded portion 141 provided on the second bonding pad 125 and a second folded portion 142 overlapping the first folded portion 141. An interface 143 may exist between the first folded portion 141 and the second folded portion 142.

The first folded portion 141 may be folded at one end of the wire loop 130. The first folded portion 141 may include a first end 141a connected to the one end of the wire loop 130 and a second end 141b opposite to the first end 141a. The second end 141b may be adjacent to a portion of the wire loop 130 spaced apart from the one end thereof. The one end of the wire loop 130 may be in contact with the second bonding pad 125. The first folded portion 141 may extend from the first end 141a to the second end 141b along a surface 125s of the second bonding pad 125. At least a portion of the first folded portion 141 may be in contact with the second bonding pad 125. In some embodiments, the first end 141a of the first folded portion 141 may be in contact with the surface 125s of the second bonding pad 125, but the second end 141b of the first folded portion 141 may not be in contact with the surface 125s of the second bonding pad 125. In some embodiments, the first folded portion 141 may not be in contact with the surface 125s of the second bonding pad 125.

The second folded portion 142 may be folded at the second end 141b of the first folded portion 141. The second folded portion 142 may include a first end 142a extending from the second end 141b of the first folded portion 141 and a second end 142b opposite to the first end 142a. The second end 142b of the second folded portion 142 may be in contact with the first folded portion 141. The first end 142a of the second folded portion 142 and the second end 141b of the first folded portion 141 may be connected to each other in a curved shape. The second end 142b of the second folded portion 142 may be provided on the first end 141a of the first folded portion 141 and may not be in contact with the second bonding pad 125.

Since the wire 95 is cut from the folded portion 140, a tail end 144 may remain on the second end 142b of the second folded portion 142. The tail end 144 may have a substantially spire-like shape protruding in a direction away from the second bonding pad 125. In some embodiments, a top surface of the second folded portion 142 may have an inclined surface 140s recessed toward the second bonding pad 125 by the movement of the capillary 90 in the fourth direction D4 illustrated in FIG. 2D and the descending operation of the capillary 90 in the fifth direction D5 illustrated in FIG. 2E.

A bottom surface of the second folded portion 142 may be in contact with a top surface of the first folded portion 141 to form the interface 143 between the first and second folded portions 141 and 142. In some embodiments, the interface 143 may have a shape bent toward the second bonding pad 125. In some embodiments, the interface 143 may have a flat shape. In some embodiments, the interface 143 may not extend to the second bonding pad 125.

In some embodiments, as illustrated in FIG. 3B, the second folded portion 142 may further extend outside the first end 141a of the first folded portion 141. The second end 142b of the second folded portion 142 may surround the first end 141a of the first folded portion 141 and may be in contact with the second bonding pad 125. In this case, the interface 143 may extend to the second bonding pad 125.

The formation of the folded portion 140 of the stitch bonding portion may be applied to the formation of the ball bonding portion. For example, after the free air ball 97 of FIG. 1B is bonded to the first bonding pad 115, a folded portion may be further formed on the first bonding pad 115 by moving the capillary 90 along an overlapping (i.e., ribbon-shaped) trajectory such as that described above with reference to FIGS. 2A to 2E.

Figure 4:
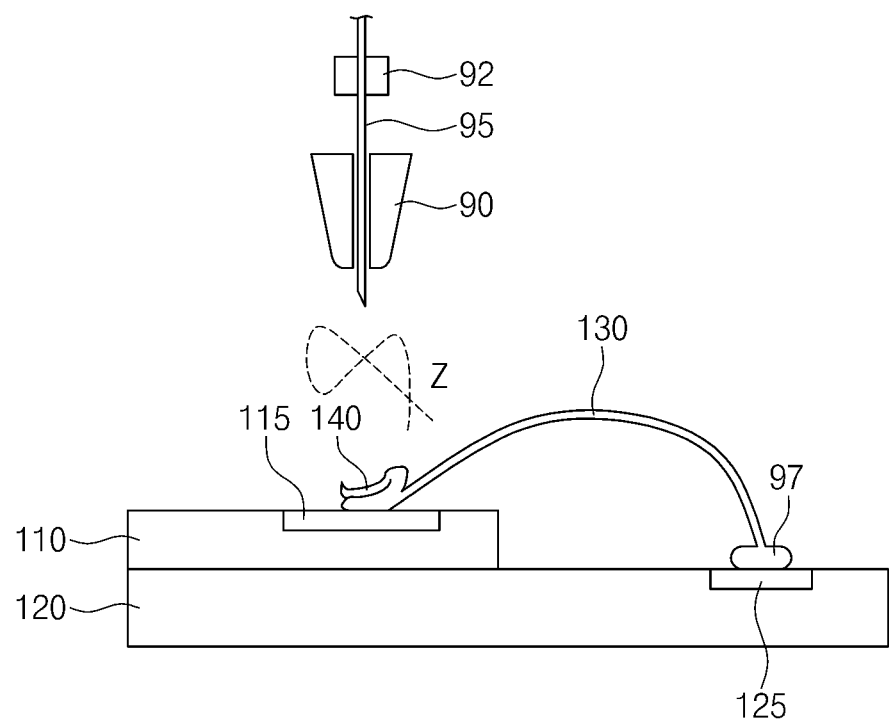
FIG. 4 is a cross-sectional view of a semiconductor device and bonding apparatus illustrating a method of forming an electrical interconnection for a semiconductor device, according to some other embodiments.

Alternatively, the ball bonding portion may be provided on the second bonding pad 125, and the double-folded stitch bonding portion 140 may be provided on the first bonding pad 115. For example, a ball bonding portion or ball 97 may be formed on the second bonding pad 125, and the wire loop 130 may extend from the ball bonding portion 97 on the second bonding pad 125 toward the first bonding pad 115. An overlapping ribbon-shaped trajectory, mirroring (or similar to) the trajectory Z described previously, may then be performed to provide a double-folded stitch bonding portion 140 on the first bonding pad 115 as shown in FIG. 4.

According to some embodiments of the inventive concepts, the stitch bonding portion may include the folded portion formed by moving the capillary along the ribbon-shaped trajectory. The folded portion may improve the strength of the stitch bonding portion, and thus it is possible to prevent damage or breakage of the bonding wire which may be caused by necking. In addition, the folded portion may also improve the adhesive force of the stitch bonding portion, and thus adhesive reliability of the bonding wire may be improved when the bonding wire is used in a semiconductor or electronic device or when a bond full test is performed. As a result, it is possible to improve electrical and mechanical durability of the semiconductor device.

As used herein, the singular terms "a", "an", and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of forming an electrical interconnection for a semiconductor device, the method comprising:
    performing a first bonding process using a bonding apparatus in which a wire is provided to connect the wire to a first bonding site;
    providing the wire from the bonding apparatus to a second bonding site to form a wire loop between the first bonding site and the second bonding site; and
    after forming the wire loop, performing a second bonding process on the second bonding site using the bonding apparatus, to bond the wire loop directly to the second bonding site,
    wherein the performing of the second bonding process comprises: moving the bonding apparatus along an overlapping trajectory on the second bonding site to form a folded portion on top of one end of the wire loop bonded to the second bonding site,
    wherein the overlapping trajectory comprises:
    a first trajectory along a first upward direction moving vertically away from the one end of the wire loop;
    a second trajectory moving along a first downward diagonal direction beginning over the one end of the wire loop, moving diagonally toward the first bonding site, and becoming vertically closer to the second bonding site;
    a third trajectory moving along a second upward direction vertically away from the one end of the wire loop; and
    a fourth trajectory moving, over the one end of the wire loop, along a second downward diagonal direction beginning from a first position, diagonally away from the second bonding site,
    diagonally downward to a second position, wherein the second position is diagonally closer to the second bonding site than the first position.

2. The method of claim 1, wherein the performing of the second bonding process further comprises:
    lowering the bonding apparatus toward the second bonding site after moving the bonding apparatus along the fourth trajectory; and
    raising the bonding apparatus from the second bonding site.

3. The method of claim 1, wherein the folded portion comprises:
    a first folded portion connected to the one end of the wire loop and extending toward the first bonding site;
    a second folded portion extending from the first folded portion and provided on the first folded portion; and
    a tail end protruding from an end portion of the second folded portion,
    wherein a bottom surface of the second folded portion is in contact with the first folded portion, and
    wherein a top surface of the second folded portion includes an inclined surface recessed toward the first folded portion.

4. The method of claim 3, wherein the first folded portion comprises:
    a first end connected to the one end of the wire loop; and
    a second end being opposite to the first end of the first folded portion and facing an opposite end of the wire loop,
    wherein the first folded portion extends from the first end of the first folded portion to the second end of the first folded portion along a surface of the second bonding site, and
    wherein the opposite end of the wire loop is bonded to the first bonding site.

5. The method of claim 4, wherein the second folded portion comprises:
    a first end extending from the second end of the first folded portion; and
    a second end being opposite to the first end of the second folded portion and facing the first end of the first folded portion,
    wherein the first end of the second folded portion and the second end of the first folded portion are connected to each other.

* * * * *